(12) United States Patent
Saino (10) Patent No.: US 6,181,018 B1
(45) Date of Patent: Jan. 30, 2001

(54) SEMICONDUCTOR DEVICE (75) Inventor: Kanta Saino, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/330,270

(22) Filed: Jun. 11, 1999

(30) Foreign Application Priority Data

Jun. 12, 1998 (JP) .................................................. 10-164719

(51) Int. Cl.$^7$ .................................................. H01L 23/58
(52) U.S. Cl. .......................................... 257/797; 257/647
(58) Field of Search ..................... 257/797, 798, 257/632, 647

(56) References Cited

U.S. PATENT DOCUMENTS

| | | | |
|---|---|---|---|
| 6,010,945 | * | 1/2000 | Wu ........................................ 257/797 |
| 6,015,744 | * | 1/2000 | Tseng .................................... 257/797 |

FOREIGN PATENT DOCUMENTS

| | | |
|---|---|---|
| 61-154126 | 7/1986 | (JP) . |
| 62-112325 | 5/1987 | (JP) . |
| 2-77111 | 3/1990 | (JP) . |
| 2-222519 | 9/1990 | (JP) . |

* cited by examiner

Primary Examiner—Carl Whitehead, Jr.
Assistant Examiner—Roy Potter
(74) Attorney, Agent, or Firm—Scully, Scott, Murphy & Presser (57) ABSTRACT

A trench is formed among a plurality of elements which are formed on a semiconductor substrate. A CVD oxide is formed in the trench so as to electronically isolate the plurality of elements. A portion of the CVD oxide smoothly protrudes from a surface area of the semiconductor substrate and forms a step. The step is an alignment mark. The step is much shallower in depth than the trench. The step includes a sidewall having inclination which is gentler than inclination of a sidewall of the trench.

5 Claims, 7 Drawing Sheets

SEMICONDUCTOR DEVICE

BACKGROUND OF THE INVENTION

1. Field of the Invention

The present invention relates to a semiconductor device and a manufacturing method of the same.

2. Description of the Related Art

In a manufacturing process of semiconductor devices, a plurality of patterns, such as an active region, an electrode, etc., are formed one after another. Thus, in a semiconductor device, a mask which has a pattern to be formed after a-previously-formed pattern needs to be arranged in an appropriate position.

For example, in a lithography process, a photomask is aligned in a predetermined position by using an alignment mark, which is formed on a semiconductor substrate. Specifically, laser is applied to the alignment mark, such as a diffraction grating or the like. In order to detect the alignment mark, a waveform of diffracted light is used, thereby the photomask can be arranged.

As the semiconductor device fabrication process becomes more and more complicated, it is difficult to retain the alignment mark in a desired state. For example, if the diffraction grating is used as the alignment mark, a film formed on the alignment mark tends to remain thereon, when patterning the film. Therefore, the form of the alignment mark may not desirably be retained.

In a case where a trench which has been made for performing shallow trench isolation (a technique for electronically isolating elements on the semiconductor substrate, by forming a trench and filling the trench with insulating materials) is used as an alignment mark, it is still difficult to retain the desirable form of the alignment mark. When a gate electrode is formed, a polycide is to be formed on the semiconductor substrate with the alignment mark. The gate electrode is formed by patterning the polycide by performing photolithography. In patterning the polycide, anisotropic etching is performed thereto. If the polycide is formed in the trench, the polycide may not completely be removed therefrom by the anisotropic etching, owing to the depth of the trench (alignment mark) for the shallow trench isolation. The amount of each polycide remaining in the trench may vary, because an etching rate of the anisotropic etching varies. That is, the form of the alignment mark may not preferably be retained after the formation of the gate electrode.

If the form of the alignment is not retained desirably, the alignment of subsequent mask may become inaccurate. As a result, the semiconductor device may be manufactured with a low degree of reliability, and the yield of such semiconductor devices is low.

SUMMARY OF THE INVENTION

Accordingly, an object of the present invention is to provide a manufacturing method capable of improving an yield of semiconductor devices.

Another object thereof is to provide a semiconductor device with a high degree of reliability.

Further object thereof is to provide a semiconductor device having an alignment mark which enables to improve alignment accuracy, and to provide a manufacturing method of the same.

In order to achieve the above-described objects, according to the first aspect of the present invention, there is provided a semiconductor device comprising:

a substrate having a surface area on which a plurality of elements are formed; and an oxide which is formed on the substrate, and which has a portion smoothly protruding from a surface of the substrate, and which forms a step as an alignment mark.

According to the present invention, patterning of wiring, etc., can be performed with a high degree of accuracy.

The oxide may be formed in a trench.

The trench may have a shallow trench isolation structure.

The oxide may form a step smaller than the trench.

With the above-described structures, formation of the step may be easily and preferably retained. As a result, alignment accuracy can be improved, and a semiconductor device with a high degree of reliability can be manufactured.

The step may include a sidewall having inclination gentler than a taper angle of the trench.

With such structures also, the formation of the step may be easily and preferably retained. Thus, the alignment accuracy can be improved, and the semiconductor device having a high degree of reliability can be manufactured.

The step may be in a range between 50 nm and 100 nm in height.

The semiconductor device may further include on the substrate and the oxide an electrode which comprises polysilicon and silicide, or metal.

According to the second aspect of the present invention, there is provided a manufacturing method of a semiconductor device comprising:

forming a first oxide and a nitride on a substrate;

patterning the nitride and the first oxide to expose an underlying portion of the substrate;

forming a trench in the substrate by using the nitride as a mask;

filling the trench with a second oxide;

making a oxide thickness difference between an alignment mark region and other areas; and forming a step as an alignment mark, by protruding a portion of the second oxide from the surface of the substrate by removing the nitride, the first oxide, and at least a portion of the second oxide.

According to the present invention, patterning of wiring, etc., can be performed with a high degree of accuracy.

The step height is smaller than a depth of the trench.

The forming the step may include forming a step in a range between 50 nm and 10 nm in height.

The forming the step may include forming a step having a sidewall with inclination gentler than a taper angle of the trench.

The making the oxide thickness difference may include:

planarizing the second oxide to expose the surface of the nitride, so that the second oxide has substantially same height as the nitride;

covering the second oxide of the alignment mark with a photoresist; and etching the second oxide in an uncovered region to a predetermined thickness.

The planarizing may include:

removing the second oxide by CMP (Chemical Mechanical Polishing) using the nitride as a stopper.

The etching the second oxide may include etching the second oxide in an uncovered region in a range between 50 nm and 100 nm.

The forming the step may include removing the nitride, the first oxide, and the at least a portion of the second oxide by performing isotropic etching.

The manufacturing method of the semiconductor device may further include:

forming a conductive film in the area including the step on the substrate;

aligning a photomask by using a step of the conductive film as an alignment mark, the step of the conductive film being shaped in accordance with a shape of the step; and patterning the conductive film.

The forming the conductive film may include forming the conductive film with polysilicon and suicide, or with metal.

The patterning the conductive film may include patterning the conductive film by performing anisotropic etching.

Other advantages and meritorious features of the present invention will become more fully understood from the preferred embodiments, the claims, the drawings, and the brief description of which follows.

DETAILED DESCRIPTION OF THE PREFERRED EMBODIMENT

A semiconductor device according to an embodiment of the present invention will now be described with reference to the accompanying drawings.

Figure 1A:
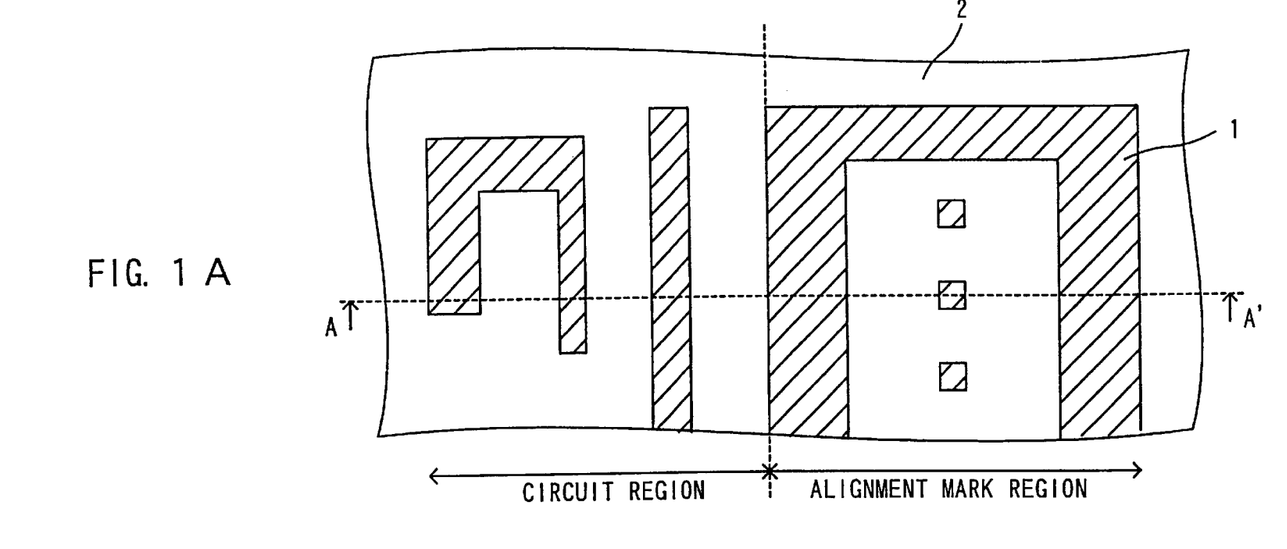
FIG. 1A is a plane view showing a pattern of active regions formed in a semiconductor device according to the present invention.
Figure 1B:
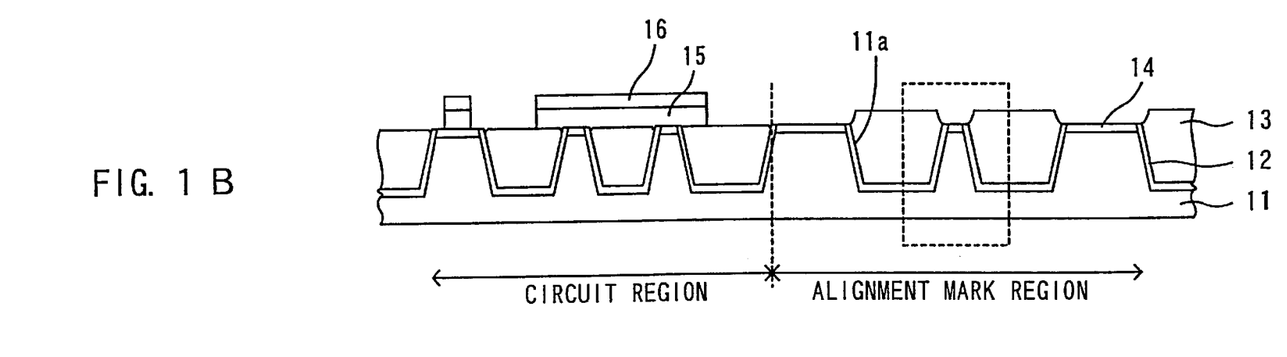
FIG. 1B is a sectional view taken along a line A–A' of FIG. 1A.

FIG. 1A is a plane view showing a pattern of active regions 1 formed in a circuit region and an alignment mark region of the semiconductor device according to the embodiment of the present invention. In FIG. 1A, the active regions 1 are shown with oblique lines. FIG. 1B is a sectional view taken along a line A–A' and illustrates a state in which a first electrode is completely formed.

As illustrated in FIGS. 1A and 1B, the plurality of active regions 1 formed in the semiconductor device are separated from each other by each element isolation area 2. The elements (the active regions 1) are isolated from each other by performing a trench isolation method for isolating the elements by filling a trench with insulating materials, which is formed in a semiconductor substrate. Widths of the active regions 1 and of the element isolation areas 2 are determined in accordance with an integration degree of the elements in the semiconductor device, and are approximately in a range from 0.1 to 100 $\mu$m.

The semiconductor device includes, as shown in FIG. 1B, a semiconductor substrate 11, a thermal oxide 12, a CVD oxide 13, a gate oxide 14, a polysilicon 15, and a tungsten suicide 16.

The semiconductor substrate 11 may be formed of a silicon substrate, etc. As illustrated in FIGS. 1A and 1B, the semiconductor substrate 11 includes a trench 11a which is formed in the element isolation areas 2.

The thermal oxide 12 is formed in a sidewall and the bottom of the trench 11a which is formed in the semiconductor substrate 11. The thermal oxide 12 removes trench-etching damage.

The CVD oxide 13 is formed on the thermal oxide 12, thereby to fill the trench 11a. The CVD oxide 13 is so formed that the active regions 1 are electrically isolated from each other. As shown in FIG. 1B, a portion of the CVD oxide 13 protrudes, in the alignment mark region, from the surface of the semiconductor substrate 11.

The gate oxide 14 is formed in the active regions 1 on the semiconductor substrate 11.

The polysilicon 15 and the tungsten silicide 16 are formed in a predetermined area on the CVD oxide 13 and the gate oxide 14. The polysilicon 15 and the tungsten silicide 16 are included in a gate electrode which is made of polycide.

Figure 2:
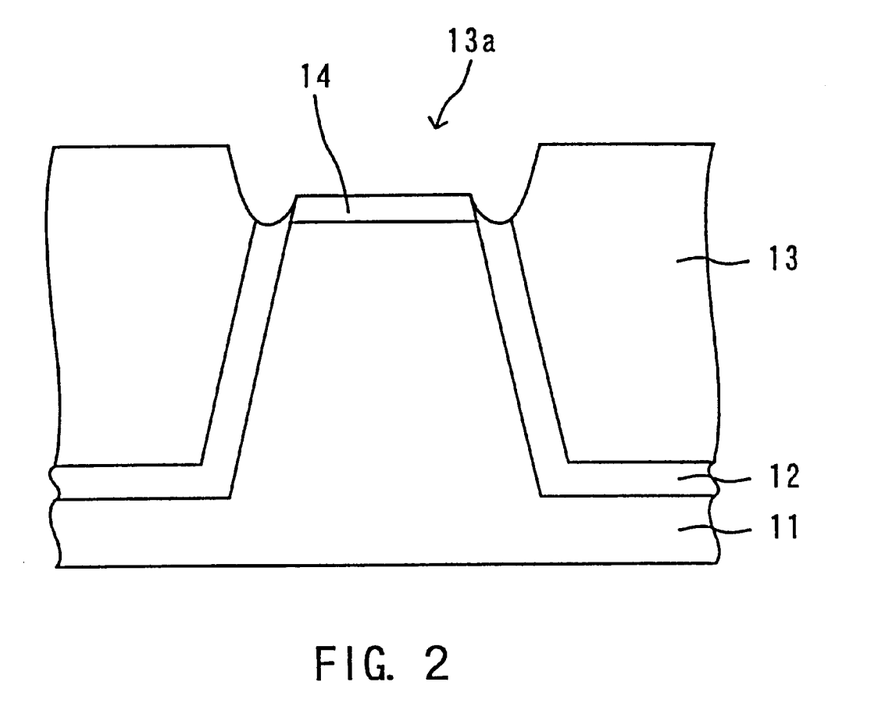
FIG. 2 is an enlarged sectional view taken around a portion enclosed with dotted lines in FIG. 1B.

With the above-described structures, the protruding portion of the CVD oxide 13 is used for the alignment during a lithography process. That is, the protruding portion of the CVD oxide 13 becomes an alignment mark. FIG. 2 is an enlarged sectional view taken around a portion, which is enclosed with dotted lines, as shown in FIG. 1B. As mentioned above, the thermal oxide 12 is formed in the sidewall and the bottom of the trench 11a. The trench 11a is completely filled with the CVD oxide 13. The gate oxide 14 is formed in the active regions 1 of the semiconductor substrate 11. The CVD oxide 13 smoothly protrudes from the surface of the semiconductor substrate 11, thereby a step 13a is formed between the CVD oxide 13 and the gate oxide 14. An alignment method using the step 13a (alignment mark) will specifically be described later.

A manufacturing method of the semiconductor device having the above-described structures will now be explained.

FIGS. 3A to 3G are sectional views each showing a manufacturing process of the semiconductor device.

Figure 3A:
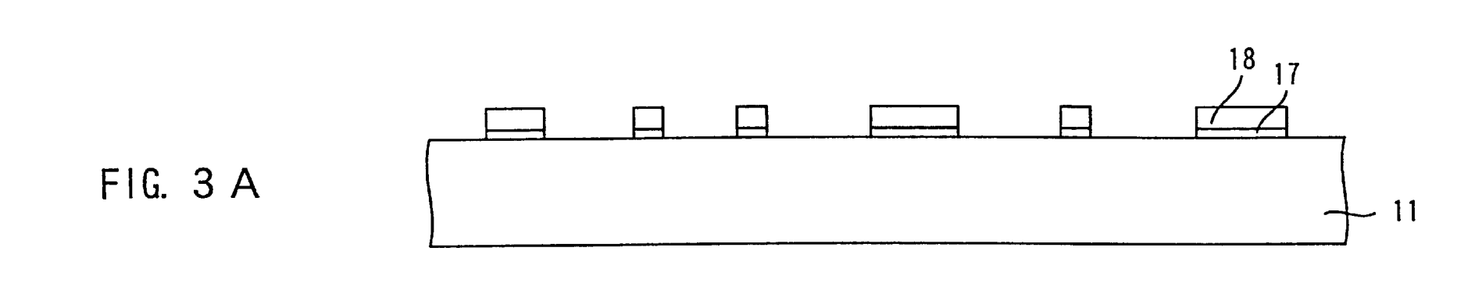
FIGS. 3A to 3G are sectional views each showing a manufacturing process of the semiconductor device shown in FIGS. 1A and 1B.

First, a pad oxide 17 is formed as a first insulating film on the semiconductor substrate 11 by employing CVD (Chemical Vapor Deposition), or the like. The pad oxide 17 is used to ease off a stress to be generated during a process, which is to be performed after the formation of the pad oxide 17. A thickness of the pad oxide 17 should suitably be in a range from 5 to 20 nm.

Next, a nitride 18 as a second insulating film is formed on the pad oxide 17 by performing CVD. The nitride 18 functions as a stopper layer when performing CMP (Chemical Mechanical Polishing). A thickness of the nitride 18 should preferably be as thin as possible unless the semiconductor substrate 11 is exposed during CMP. Particularly, the thickness of the nitride 18 should preferably be in a range from 100 to 300 nm.

Now, a photoresist (not shown) having a thickness of, for example, approximately 1 $\mu$m, is formed on the entire surface of the nitride 18. The photoresist is patterned by photolithography, so that a portion of the photoresist which corresponds to the active regions 1 remains thereon. While the patterned photoresist is used as a mask, the pad oxide 17 and the nitride 18 are patterned, and portions of the semiconductor substrate 11 are exposed, as illustrated in FIG. 3A. Accordingly, the pad oxide 17 and the nitride 18 are patterned in such a way that the portions corresponding to the active regions 1 remain on the semiconductor substrate 11. The areas from where the pad oxide 17 and the nitride 18 are removed are the element isolation areas 2. If the pattern of the pad oxide 17 and the nitride 18 differs, the element isolation areas 2 may be formed to have a variety of widths. The pad oxide 17 and the nitride 18 may be patterned by means of an anisotropic RIE (reactive ion etching) method while using $CF_4$ (Carbon Tetrafluoride) gas, etc., as etching gas.

Figure 3B:
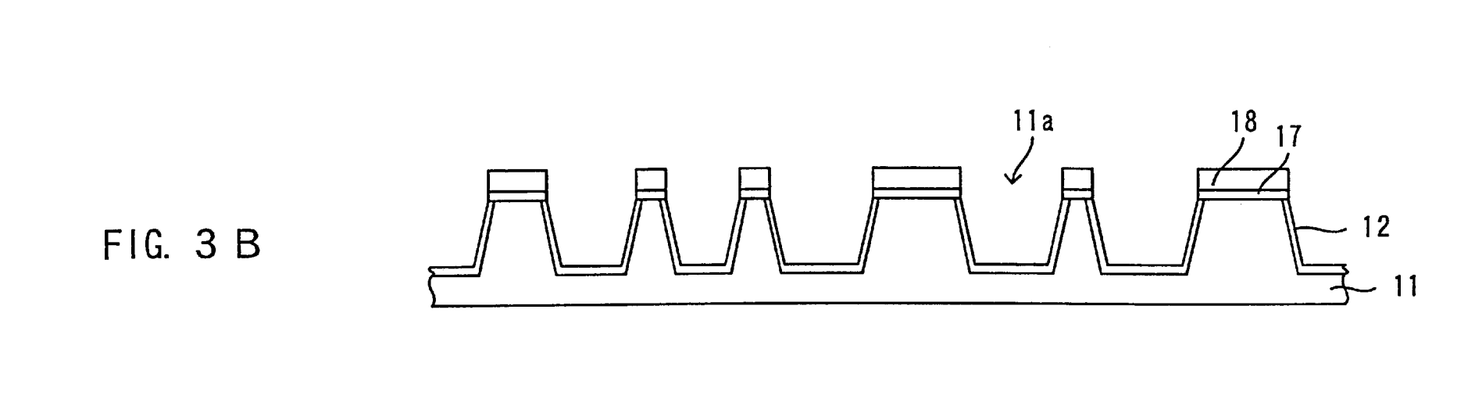

The nitride 18 is used as a mask, after the photoresist removal, and the trench 11 a with a desired depth is formed on the semiconductor substrate 11 by performing anisotropic etching, as illustrated in FIG. 38. The etching gas may, for example, be HBr gas. The depth of the trench 11a is 300 nm, for example. The trench 11a can be formed therein, before removing the photoresist. In such a case, the photoresist on the nitride 18 is used as a mask for etching the semiconductor substrate 11.

After the trench 11a is formed, the nitride 18 is used as a mask having oxidation resistance. As illustrated in FIG. 3B, the thermal oxide 12 is formed as a third insulating film in the sidewall and the bottom of the trench 11a, by performing thermal oxidation. A thickness of the thermal oxide 12 should suitably be in a range from 10 to 50 nm.

Figure 3C:
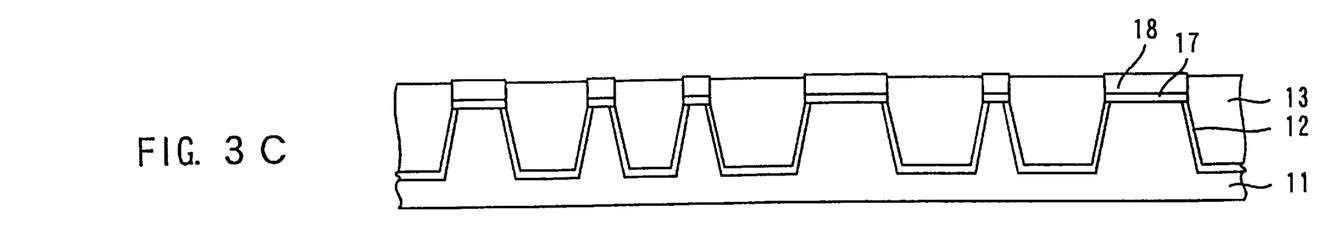

The CVD oxide 13 as an isolation insulating film for electronically isolating the elements is approximately 600 nm in thickness and is deposited on the thermal oxide 12, by performing bias ECR-CVD (Electric Cyclotron Resonance-CVD), etc. With such a structure, the trench 11a is filled with the CVD oxide 13. The CVD oxide 13 is polished so as to have the even surface, until the surface of the nitride 18 as the stopper layer is exposed by CMP, as shown in FIG. 3C. The CVD oxide 13 is fully planarized and heights of the CVD oxide 13 are approximately the same in both of the circuit region and the alignment mark region.

Figure 3D:
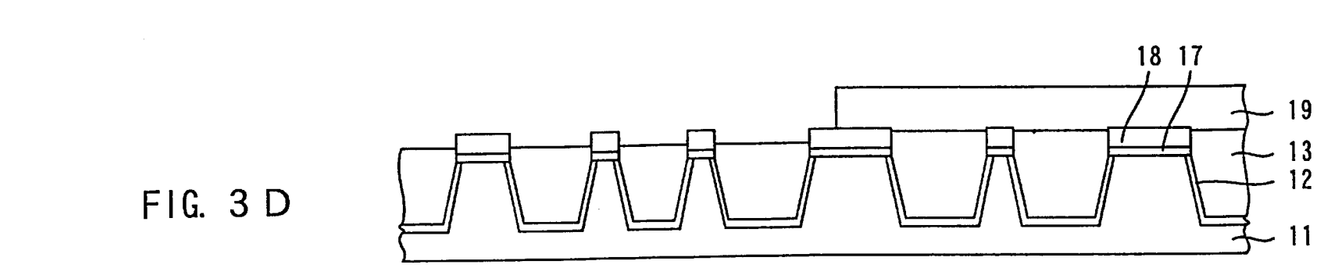

A photoresist 19 is formed on the entire surfaces of the CVD oxide 13 and the nitride 18. As illustrated in FIG. 3D, the photoresist 19 is patterned by performing the photolithography. Particularly, the patterning of the photoresist 19 is performed as to cover only the alignment mark region. The CVD oxide 13 is etched while using the patterned photoresist 19 as a mask, as shown in FIG. 3D. By etching the CVD oxide 13, a difference in oxide thickness is to be made between the alignment mark region and other regions. In a case where the CVD oxide 13 is etched by performing anisotropic etching, a process of reactive etching using the $CF_4$ gas, etc., is performed. On the contrary, if the CVD oxide 13 is etched by performing isotropic etching, buffered HF is used, for example. The CVD oxide 13 of the regions besides the alignment mark region are etched so as to have heights approximately 50 to 100 nm lower than heights of the CVD oxide 13 in the alignment mark region. That is, the CVD oxide 13 in the alignment mark region protrudes in the higher height of 50 to 100 nm than those of the CVD oxide 13 in the another portion (i.e., in the circuit region).

Figure 3E:
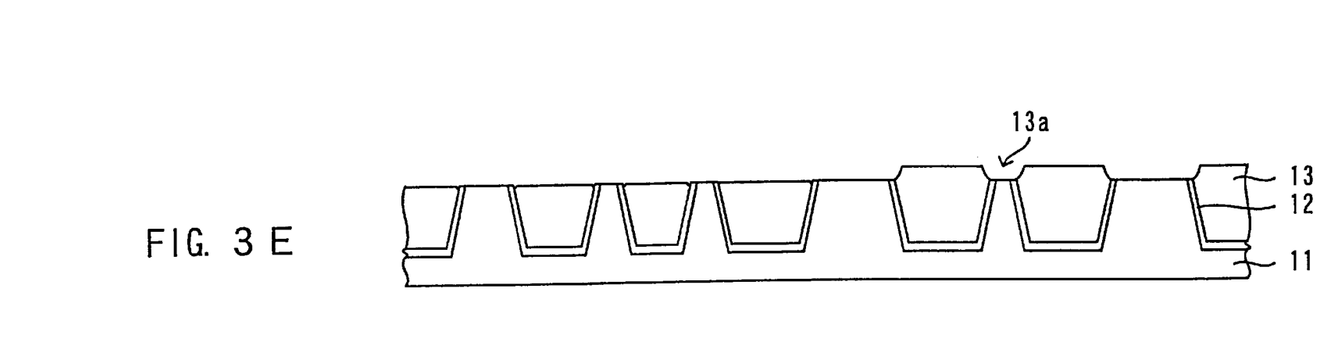

As illustrated in FIG. 3E, after the photoresist 19 removal, the pad oxide 17 and the nitride 18 are removed as well, by performing the isotropic etching. In this isotropic etching, the CVD oxide 13 are also etched. For example, in a case where a wet etching method is performed, the nitride 18 is removed by means of hot phosphoric acid, and the pad oxide 17 is removed by the buffered HF. The CVD oxide 13 in the alignment mark region protrude in the higher height of 50 to 100 nm than those in the circuit region. Thus, the CVD oxide 13 in the circuit region are etched as to have approximately the same height as the semiconductor substrate 11, so that the CVD oxide 13 in the alignment mark region protrude from the surface of the semiconductor substrate 11 about 50 to 100 nm. By performing the isotropic etching, the CVD oxide 13 smoothly protrude from the semiconductor substrate 11, as shown in FIG. 2. Accordingly, a smooth symmetrical step 13a is formed in the alignment mark region. Because the step 13a is shallow with a height in a range from 50 to 100 nm, inclination of a sidewall of the step 13a is gentler than that of the sidewall of the trench 11a, by performing the isotropic etching.

Accordingly, the trench isolation can be completely performed, and the step 13a as the alignment mark can be formed.

Figure 3F:
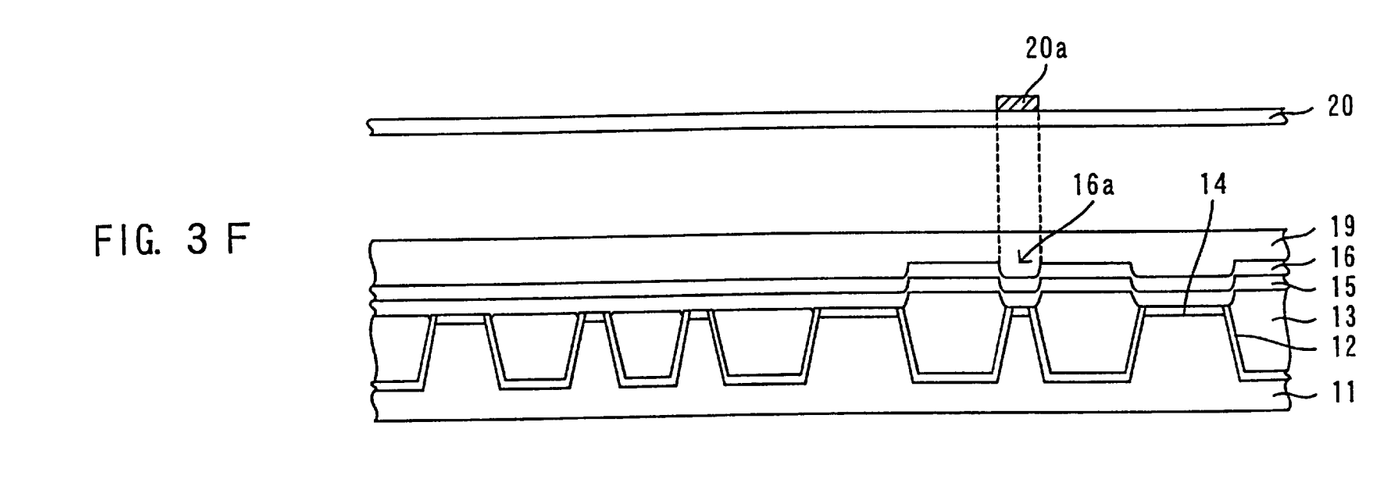

An oxidation process is performed for the areas corresponding to the active regions 1 of the semiconductor substrate 11. In the oxidation process for such areas, as shown in FIG. 3F, the gate oxide 14 with a thickness of, for example, about 8 nm is formed on the active regions 1 of the semiconductor substrate 11. As illustrated in FIG. 3F, the polysilicon 15 is formed on the CVD oxide 13 and the gate oxide 14 by the CVD, for example. Subsequently, as shown in FIG. 3F, the tungsten silicide 16 is formed on the polysilicon 15 by performing, for example, a sputtering method. Each thickness of the polysillcon 15 and of the tungsten silicide 16 is approximately 100 nm, for example. The polysilicon 15 and the tungsten suicide 16 in the alignment mark region are shaped in accordance with a shape of the CVD oxide 13, as shown in FIG. 3F. Thus, each of the polysilicon 15 and the tungsten silicide 16 includes a step 16a with a shape which is identical with that of the step 13a. The step 16a is used as an alignment mark when patterning the polysilicon 15 and the tungsten suicide 16.

Figure 4A:
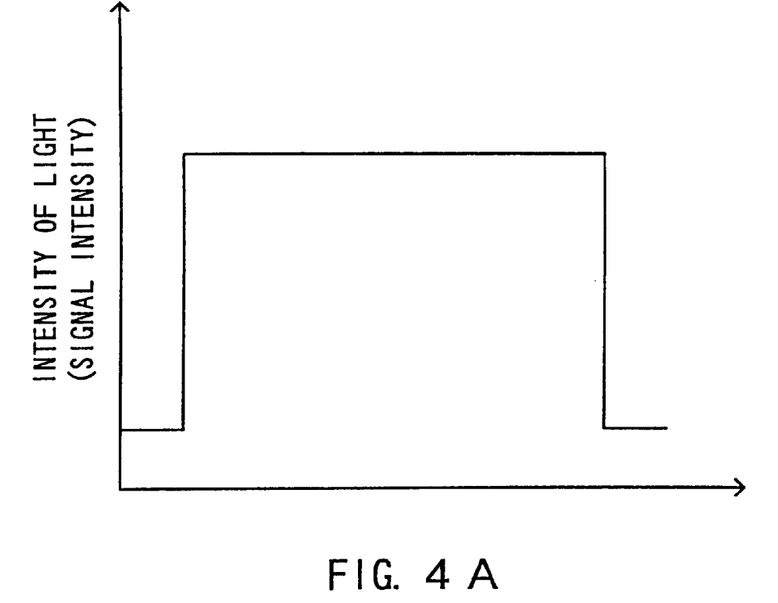
FIG. 4A is a diagram showing intensity of light which light has been reflected except in an alignment mark shown in FIG. 1B.
Figure 4B:
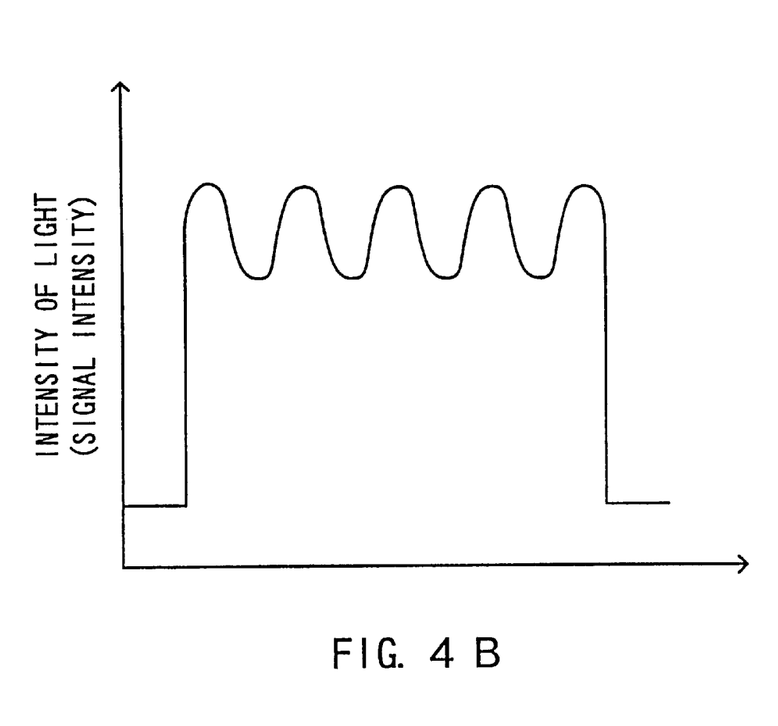
FIG. 4B is a diagram showing intensity of light which light has been reflected in the alignment mark shown in FIG. 1B.

Afterwards, as illustrated in FIG. 3F, the photoresist 19 is formed on the tungsten silicide 16. Light is emitted to the photoresist 19 via a photomask 20, so that the photoresist 19 is patterned by developing the photoresist 19. More particularly, a particular wavelength light (for example, later and the like) which the photoresist 19 does not absorb is emitted on the photoresist 19. The polycide (including the polysilicon 15 and the tungsten suicide 16) easily reflects light, thus the light is reflected in the surface of the tungsten suicide 16. As shown in FIG. 4A, since the surface of the tungsten silicide 16 is flatly formed except in the alignment mark (step 16a), intensity of the light (signal intensity) reflected except in the alignment mark is constant On the other hand, as illustrated in FIG. 4B, intensity of the light (diffraction light) reflected in the step 16a is fluctuated in a constant cycle. An appropriate position of the step 16a (alignment mark) is detected by checking such intensity distribution of the reflected light.

As seen from FIG. 3F, the photomask 20 is arranged on the photoresist 19 in order that a position of a mark 20a, which indicates the position corresponding to the step 16a affixed to the photomask 20, and the position of the step 16a meet with each other. The photoresist 19 is exposed and developed so as to be patterned.

Figure 3G:
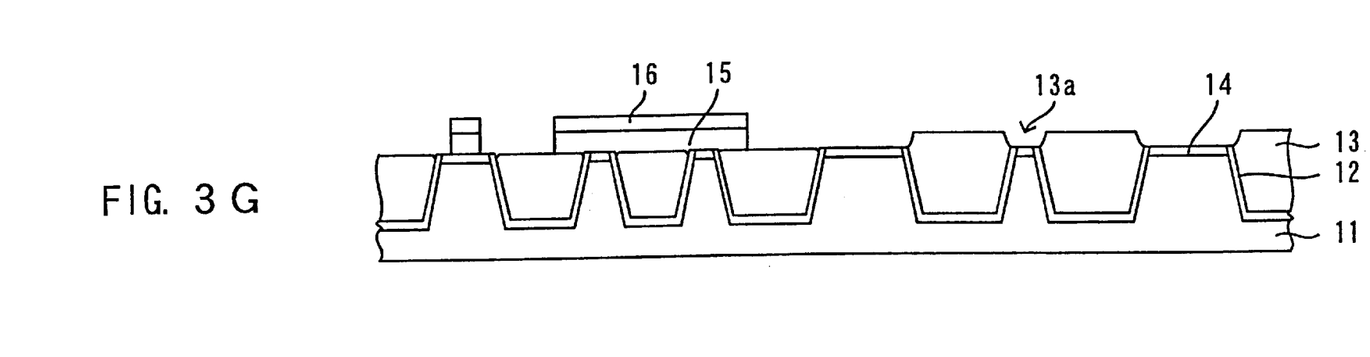

After the photoresist 19 is patterned, the polysilicon 15 and the tungsten suicide 16 are patterned by performing the anisotropic etching, as shown in FIG. 3G. In this patterning, the etching condition, by which the etching rate of the CVD oxide 13 becomes sufficiently lowered than those of the polysilicon 15 and the tungsten silicide 16, is used. For example, $SF_6$ (sulfur hexafluoride) and $Cl_2$ (Chlorine) are used as the etching gas. The step 13a, which is formed by protruding the CVD oxide 13, is shallow. The inclination of the step 13a is gentle compared to that of the sidewall of the trench 11a. Accordingly, in a case where the polysilicon 15 and the tungsten silicide 16 are to be etched, overetching processing can be less performed during the process of the above-described elements. Therefore, even if the anisotropic etching is performed, the polysilicon 15 and the tungsten suicide 16 can be clearly removed from the step 13*a*. Furthermore, the form of the step 13*a* can be suitably retained, thus the appropriate alignment is obtained.

Accordingly, the semiconductor device with such structures shown in FIG. 1B is completed. Further, the step 13*a* which is symmetrical, shallow and smooth, as illustrated in FIG. 2, can be formed according to the above-described manufacturing method. As explained above, the smooth symmetrical step 13*a* can be further formed on the film which is formed on the step 13*a*. The film formed on the step 13*a* can be completely removed therefrom in the etching processing. The form of the step 13*a* can be preferably retained by the photolithography which is performed afterwards, because the polysilicon film 15 and the tungsten silicide 16 are removed completely from the step 13*a*. According to the manufacturing method of the present invention, the alignment with high accuracy can be realized, and the yield of the semiconductor device can be highly achieved. Further, the semiconductor device having a high degree of reliability can be manufactured.

Figure 5:
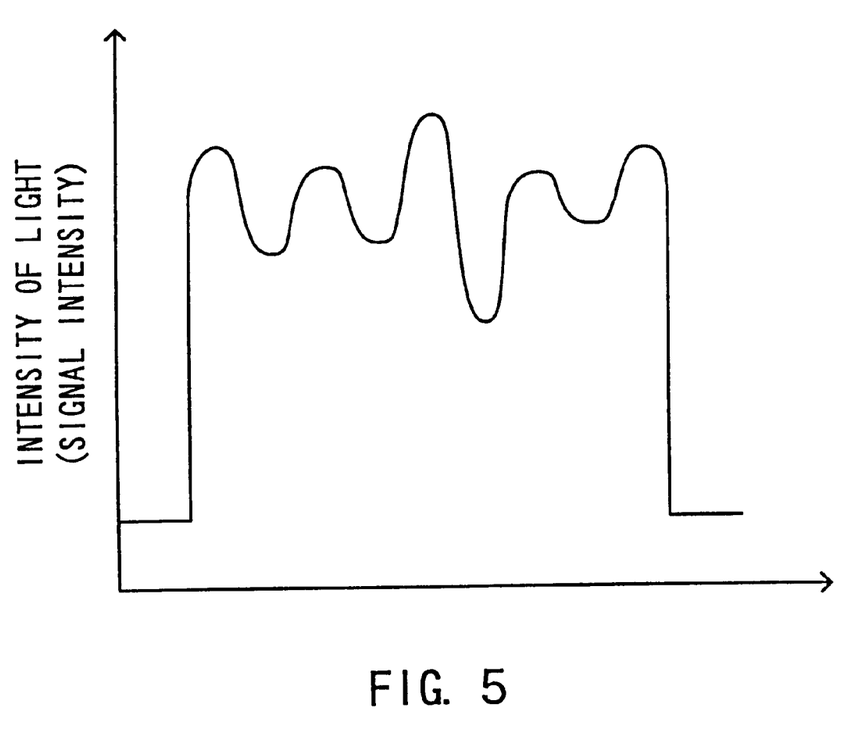
FIG. 5 is a diagram showing intensity of light which light has been reflected in a surface with unevenness.

It should be noted that if a conductive film is formed after the formation of a plurality of wiring layers, etc., the surface of the conductive film may be unevenly formed. If the surface of the film is very uneven, the intensity distribution of the light reflected therein indicates irregularity of the light, as shown in FIG. 5. However, the form of the step 13*a* as the alignment mark is retained, thus the conductive film which is formed as the highest layer above the step 13*a* includes a step having a shape identical with that of the step 13*a* Accordingly, the appropriate position of the alignment mark can be detected according to the above-described method. Thus, the alignment with high accuracy can be realized, the yield of the semiconductor device can be highly achieved. Further, the semiconductor device having a high degree of reliability can be manufactured.

A step which is shallow, smooth, and symmetrical as the same as the above step 13*a* can be formed in a caliper region (not shown) in accordance with the above-described method. The calipers are a mark formed on the semiconductor substrate 11, in order that the arrangement position of the mask and the like can be recognized. In a case where a step is formed in the caliper region, the photoresist 19 is to be patterned so that the areas except for the alignment mark region and the caliper region are exposed, in the process shown in FIG. 3D. The accuracy of the alignment can also be obtained, if the step is formed likewise in the caliper region in accordance with the above-described method.

The above-described manufacturing method can be applied to any kind of semiconductor device, as long as the semiconductor device comprises a structure of trench isolation and an electrode which is made of polycide or a metal material.

The photomask 20 is arranged in an appropriate position according to a method which is different from that shown in FIG. 3F, since the form of the step 13*a* (alignment mark) is preferably retained, as explained above.

The position of the alignment mark may be detected by emitting light to the alignment mark (step 13*a* or step 16*a*), while the photomask 20 is fixed in a predetermined position. A relative position of the photomask 20 and the alignment mark is calculated, to arrange positions of the photomask 20 and the semiconductor substrate 11 appropriately.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-164719 filed on Jun. 12, 1998, which is incorporated herein by reference in its entirety.

What is claimed is:

1. A semiconductor device comprising: a substrate having a surface area on which a plurality of elements are formed; and an oxide which is formed on said substrate, and which has a portion smoothly protruding from a surface of said substrate, and which forms a step as an alignment mark, wherein said oxide is formed in a trench, and said trench has a shallow trench isolation structure.

2. The semiconductor device according to claim 1, wherein said oxide forms a step smaller than a depth of said trench.

3. The semiconductor device according to claim 2, wherein said step includes a sidewall with inclination gentler than a taper angle of said trench.

4. The semiconductor device according to claim 3, wherein said step is in a range between 50 nm and 100 nm in height.

5. The semiconductor device according to claim 1, further comprising on said substrate and said oxide an electrode which comprises polysilicon and suicide, or metal.

* * * * *